(12) United States Patent
Stojanovic et al.

(10) Patent No.: US 9,916,240 B2
(45) Date of Patent: Mar. 13, 2018

(54) INTERLEAVER AND DE-INTERLEAVER FOR CORRECTING A BURST BIT ERROR

(71) Applicant: Huawei Technologies Co., Ltd., Shenzhen, Guangdong (CN)

(72) Inventors: Nebojsa Stojanovic, Munich (DE); Yu Zhao, Munich (DE); Yang Li, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 981 days.

(21) Appl. No.: 13/891,926

(22) Filed: May 10, 2013

(65) Prior Publication Data

US 2013/0254499 A1    Sep. 26, 2013

Related U.S. Application Data

(63) Continuation of application No. PCT/CN2011/077771, filed on Jul. 29, 2011.

(51) Int. Cl.
*G06F 12/00* (2006.01)
*G06F 12/06* (2006.01)
(Continued)

(52) U.S. Cl.
CPC .... *G06F 12/0607* (2013.01); *H03M 13/2703* (2013.01); *H03M 13/275* (2013.01);
(Continued)

(58) Field of Classification Search
CPC ............. G06F 12/127; G06F 12/0607; H03M 13/2703; H03M 13/275; H03M 13/2778; H03M 13/23; H04L 1/0071
(Continued)

(56) References Cited

U.S. PATENT DOCUMENTS 4,217,660 A      8/1980 En
4,539,684 A  *   9/1985 Kloker ................... H04L 7/048
                                                      714/788
(Continued)

FOREIGN PATENT DOCUMENTS

CN         1314028 A      9/2001
CN       101237440 A      8/2008
(Continued)

OTHER PUBLICATIONS

"Convolutional Code," Wikipedia, the free encyclopedia (Mar. 30, 2010).

(Continued)

*Primary Examiner* — Reba I Elmore
(74) *Attorney, Agent, or Firm* — Leydig, Voit & Mayer, Ltd.

(57) ABSTRACT

The present invention relates to an interleaving and de-interleaving method, an interleaver and a de-interleaver. The interleaving method includes: receiving N×M frames of data, and sequentially storing, with each frame as a unit, the N×M frames of data in storage space indicated by N×M addresses of a first storage unit; transferring the data stored in the storage space indicated by an $((X-1) \times M + Y + 1)^{th}$ address of the first storage unit to the storage space indicated by a $(Y \times N + X)^{th}$ address of a second storage unit; and according to an address sequence, outputting the data stored in the space indicated by the N×M addresses of the second storage unit frame by frame. The interleaving and de-interleaving solutions of the present invention have low implementation complexity, and high capacity of correcting a burst bit error.

10 Claims, 6 Drawing Sheets

(51) Int. Cl.
*H04L 1/00* (2006.01)
*H03M 13/27* (2006.01)
*H03M 13/23* (2006.01)

(52) U.S. Cl.
CPC ...... *H03M 13/2778* (2013.01); *H04L 1/0071* (2013.01); *H03M 13/23* (2013.01)

(58) Field of Classification Search
USPC ...... 711/157, 165; 710/53, 56; 712/225, 248
See application file for complete search history.

(56) References Cited

U.S. PATENT DOCUMENTS

| | | | | |
|---|---|---|---|---|
| 6,425,026 | B1* | 7/2002 | Morris | G06T 1/20 710/100 |
| 6,560,362 | B1 | 5/2003 | Piret et al. | |
| 6,754,290 | B1* | 6/2004 | Halter | H03M 13/2957 375/340 |
| 7,055,088 | B2 | 5/2006 | Betts | |
| 7,302,620 | B2* | 11/2007 | Kim | H03M 13/2703 711/5 |
| 7,631,243 | B2 | 12/2009 | Nieto | |
| 8,266,500 | B2* | 9/2012 | Kim | H03M 13/271 714/762 |
| 2002/0141507 | A1* | 10/2002 | Morgan | H03M 13/23 375/265 |
| 2005/0071729 | A1* | 3/2005 | Kim | H03M 13/2703 714/755 |
| 2006/0224935 | A1 | 10/2006 | Cameron et al. | |
| 2006/0271751 | A1* | 11/2006 | Chen | H03M 13/271 711/157 |
| 2007/0055920 | A1* | 3/2007 | Iwata | G11B 20/1803 714/762 |
| 2007/0208988 | A1* | 9/2007 | Aman | H03M 13/2764 714/761 |
| 2007/0266274 | A1* | 11/2007 | Lin | H03M 13/2703 714/699 |
| 2008/0163025 | A1 | 7/2008 | Djordjevic et al. | |
| 2008/0256417 | A1* | 10/2008 | Andersson | H03M 13/15 714/762 |
| 2009/0100300 | A1* | 4/2009 | Kim | H03M 13/271 714/702 |
| 2010/0122149 | A1 | 5/2010 | Coe | |
| 2010/0146229 | A1* | 6/2010 | Yang | G06F 12/0207 711/157 |
| 2010/0149427 | A1* | 6/2010 | Limberg | H04N 5/4401 348/724 |
| 2010/0192047 | A1 | 7/2010 | Murakami et al. | |
| 2010/0293433 | A1 | 11/2010 | Limberg | |
| 2010/0318878 | A1* | 12/2010 | Mansour | H03M 13/2714 714/755 |
| 2012/0110232 | A1* | 5/2012 | Amitay | G06F 13/28 710/308 |

FOREIGN PATENT DOCUMENTS

| | | |
|---|---|---|
| EP | 1111797 A1 | 6/2001 |
| EP | 1420518 A2 | 5/2004 |
| GB | 2465611 A | 5/2010 |
| WO | WO 03096597 A1 | 11/2003 |

OTHER PUBLICATIONS

International Search Report in corresponding PCT Patent Application No. PCT/CN2011/077771 (May 10, 2012).
$1^{st}$ Office Action in corresponding Chinese Patent Application No. 201180001704.5 (Mar. 22, 2013).

* cited by examiner

INTERLEAVER AND DE-INTERLEAVER FOR CORRECTING A BURST BIT ERROR

CROSS-REFERENCE TO RELATED APPLICATIONS

This application is a continuation of International Patent Application No. PCT/CN2011/077771, filed on Jul. 29, 2011, which is hereby incorporated by reference in its entirety.

FIELD OF THE INVENTION

The present invention relates to the field of communications, and in particular, to an interleaving and de-interleaving method, an interleaver and a de-interleaver.

BACKGROUND OF THE INVENTION

FEC (Forward Error Correction, forward error correction) is an error control technology in data transmission, and is widely used in communications field such as optical communication. The FEC has strong error correction capacity, and while a bit error rate before correction of long distance data transmission is greater than 2E-2 (representing that at most 1 bit error occurs when transmitting $2 \times 10^2$ bits), the bit error after FEC error correction can be kept below 1E-15.

In an optical communication system, a burst noise existing in a channel may lead to a burst bit error. The FEC has certain capacity of correcting the burst bit error; however, when the burst bit error caused by the burst noise in the channel exceeds the capacity of correcting the burst bit error of the FEC, the bit error may be spread, and a serious bit error rate after correction is generated.

To deal with the burst bit error, a channel interleaving solution is usually adopted in this field, that is, a continuous burst bit error is "scattered" to different FEC code words, so that the volume of the burst bit error in each code word is smaller than the capacity of correcting the burst bit error of the FEC. The specific method is: interleaving data after FEC coding at a transmitting end, correspondingly de-interleaving the interleaved data after being transmitted through a channel at a receiving end, and performing FEC decoding on the de-interleaved data. Three channel interleaving solutions exist in the prior art, namely, block interleaving, bit interleaved interleaving, and helical interleaving.

FIG. 1A is a schematic diagram of a block interleaving solution. The block interleaving specifically adopts a "row-in and column-out" manner, that is, an information flow is buffered with an order of the row in a storage and then output in the column direction.

FIG. 1B is a schematic diagram of a bit interleaving solution. The bit interleaved interleaving specifically mixes two information flows in a bit interleaved manner.

FIG. 1C is a schematic diagram of a helical interleaving solution. The helical interleaving specifically adopts a "row-in and twill-out" manner, that is, an information flow is buffered with an order of the row in a storage and then output in the twill direction.

However, when the foregoing three interleaving solutions match with a block convolutional decoder to correct the burst bit error, with increase of the interleave depth, the capacity of correcting the burst bit error of the foregoing three interleaving solutions may meet a bottleneck, and the implementation complexity of the three interleaving solutions is high.

SUMMARY OF THE INVENTION

To overcome the problem existing in the interleaving solutions of the prior art, the present invention provides an interleaving and de-interleaving method, an interleaver and a de-interleaver.

In one aspect, the present invention provides an interleaving method, which includes:

receiving N×M frames of data, and sequentially storing, with each frame as a unit, the N×M frames of data in storage space indicated by N×M addresses of a first storage unit, where the storage space indicated by each address is capable of storing one frame of data, and both N and M are natural numbers greater than 1;

transferring the data stored in the storage space indicated by an $((X-1) \times M+Y+1)^{th}$ address of the first storage unit to the storage space indicated by a $(Y \times N+X)^{th}$ address of a second storage unit, where the second storage unit includes storage space indicated by N×M addresses, and the storage space indicated by each address of the second storage unit is capable of storing one frame of data; when N=M=2, X=[1,2] and Y=[0,1]; and when N and M are natural numbers greater than 2, X=1 . . . N; Y=0 . . . M−1; and according to an address sequence, outputting the data stored in the space indicated by the N×M addresses of the second storage unit frame by frame.

In another aspect, an embodiment of the present invention provides a de-interleaving method, which includes:

receiving N×M frames of data, and sequentially storing, with each frame as a unit, the N×M frames of data in storage space indicated by N×M addresses of a third storage unit, where the storage space indicated by each address is capable of storing one frame of data, and both N and M are natural numbers greater than 1;

transferring the data stored in the storage space indicated by a $(B \times N+A)^{th}$ address of the third storage unit to the storage space indicated by an $((A-1) \times M+B+1)^{th}$ address of a fourth storage unit, where the fourth storage unit includes storage space indicated by N×M addresses, and the storage space indicated by each address of the fourth storage unit is capable of storing one frame of data; when N=M=2, A=[1,2] and B=[0,1]; and when N and M are natural numbers greater than 2, A=1 . . . N; B=0 . . . M−1; and according to an address sequence, outputting, with each frame as a unit, the N×M frames of data stored in the fourth storage unit.

In still another aspect, the present invention provides an interleaver, which includes: a first storage unit, a second storage unit, and an interleaving processor, where both the first storage unit and the second storage unit have storage space indicated by N×M addresses, the storage space indicated by each address is capable of storing one frame of data, and both N and M are natural numbers greater than 1.

The first storage unit is configured to receive N×M frames of data, and sequentially store, with each frame as a unit, the N×M frames of data in the storage space indicated by the N×M addresses.

The interleaving processor is configured to read one frame of data from the storage space indicated by an $((X-1) \times M+Y+1)^{th}$ address of the first storage unit, and store the one frame of data, which has been read, in the storage space indicated by a $(Y \times N+X)^{th}$ address of the second storage unit, where when N=M=2, X=[1,2] and Y=[0,1]; and when N and M are natural numbers greater than 2, X=1 . . . N; Y=0 . . . M−1.

The second storage unit is configured to output the data stored in the space indicated by N×M addresses frame by frame according to an address sequence.

In still another aspect, the present invention provides a de-interleaver, which includes: a third storage unit, a fourth storage unit, and a de-interleaving processor, where both the third storage unit and the fourth storage unit have storage space indicated by N×M addresses, the storage space indicated by each address is capable of storing one frame of data, and both N and M are natural numbers greater than 1.

The third storage unit is configured to receive N×M frames of data, and sequentially store, with each frame as a unit, the N×M frames of data in the storage space indicated by the N×M addresses of the third storage unit.

The de-interleaving processor is configured to read one frame of data from the storage space indicated by a $(B \times N + A)^{th}$ address of the third storage unit, and store the one frame of data, which has been read, in the storage space indicated by an $((A-1) \times M + B + 1)^{th}$ address of the fourth storage unit; when N=M=2, A=[1,2] and B=[0,1]; and when N and M are natural numbers greater than 2, A=1 ... N; B=0 ... M−1.

The fourth storage unit is configured to, according to an address sequence, output, with each frame as a unit, the N×M frames of data stored by the fourth storage unit.

The interleaving and de-interleaving solutions provided by the embodiments of the present invention can implement interleaving or de-interleaving merely through transferring data frames to change the original sequence of the data frames, and therefore the implementation complexity is low, in addition, the data frames are transferred in combination with features of the convolutional code, which may achieve a good effect of correcting the burst bit error, and the capacity of correcting the burst bit error linearly increases with the increase of the interleave depth.

BRIEF DESCRIPTION OF THE DRAWINGS

To illustrate the technical solutions according to the embodiments of the present invention or in the prior art more clearly, the accompanying drawings required for describing the embodiments or the prior art are introduced briefly below. Apparently, the accompanying drawings in the following descriptions merely show some of the embodiments of the present invention, and persons skilled in the art may obtain other drawings according to the accompanying drawings without creative efforts.

DETAILED DESCRIPTION OF THE EMBODIMENTS

The technical solutions of the present invention are to be clearly and described in the following with reference to the accompanying drawings. It is obvious that the embodiments to be described are a part rather than all of the embodiments of the present invention. All other embodiments obtained by persons skilled in the art based on the embodiments of the present invention without creative effects shall fall within the protection scope of the present invention.

In order to make the objectives, technical solutions and advantages of the present invention clearer, the embodiments of the present invention are described in detail in the following with reference to the accompanying drawings.

Figure 1A:
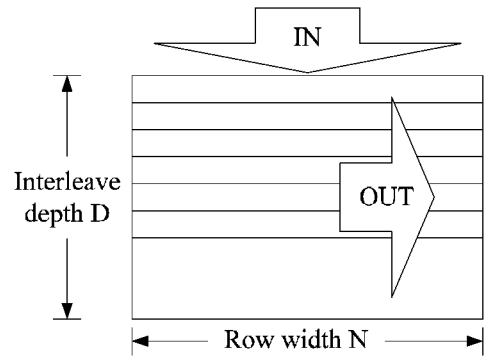
FIG. 1A is a schematic diagram of a block interleaving solution in the prior art.
Figure 1B:
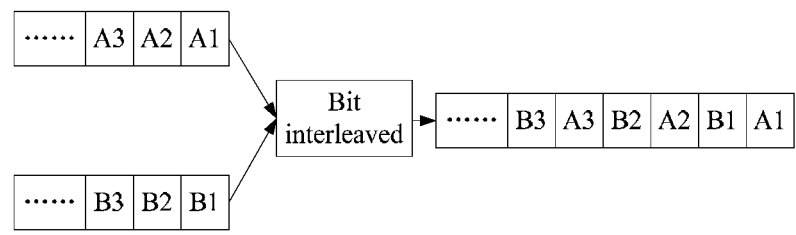
FIG. 1B is a schematic diagram of a Bit interleaving solution in the prior art.
Figure 1C:
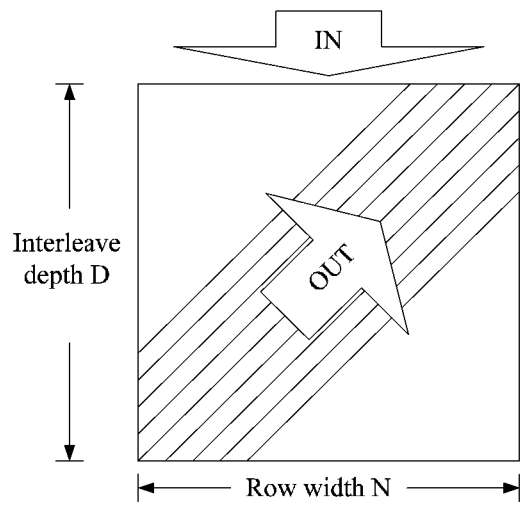
FIG. 1C is a schematic diagram of an helical interleaving solution in the prior art.
Figure 2A:
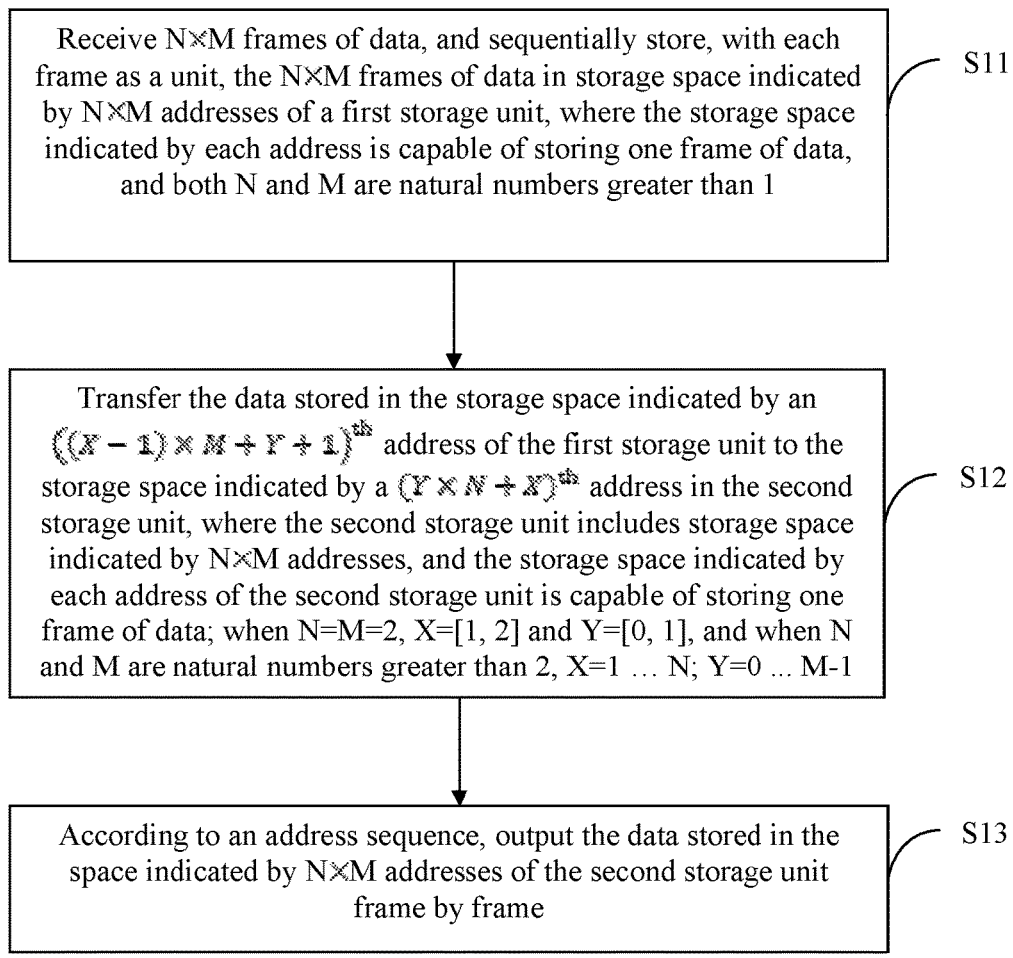
FIG. 2A is a flow chart of an interleaving method provided in an embodiment of the present invention.

An embodiment of the present invention provides an interleaving method, and the flow chart of it is shown in FIG. 2A, which includes the following steps:

Step S11: Receive N×M frames of data, and sequentially store, with each frame as a unit, the N×M frames of data in storage space indicated by N×M addresses of a first storage unit, where the storage space indicated by each address is capable of storing one frame of data, and both N and M are natural numbers greater than 1. In the present invention, the N×M represents interleave depth, and specific values of N and M may be determined according to a burst noise level of a channel and a block convolution algorithm, for example, if the depth of one block convolution of the block convolutional code is K, N=K, M is generally a value greater than or equal to 2, and the greater the burst noise of the channel is, the greater the value of M is. In the present invention, the specific values of N and M are not limited thereto.

Step S12: Transfer the data stored in the storage space indicated by an $((X-1) \times M + Y + 1)^{th}$ address of the first storage unit to the storage space indicated by a $(Y \times N + X)^{th}$ address in a second storage unit, where the second storage unit includes storage space indicated by N×M addresses, and the storage space indicated by each address of the second storage unit is capable of storing one frame of data; when N=M=2, X=[1,2] and Y=[0,1]; and when N and M are natural numbers greater than 2, X=1 ... N; Y=0 ... M−1.

In this embodiment, the size of the storage space indicated by each address in the first storage unit and the second storage unit may at least match the size of one frame of data, that is, if one frame of data has L bits, the size of the storage space indicated by each address is at least L bits, and the sizes of the first storage unit and the second storage unit are at least N×M×L bits.

Step S13: According to an address sequence, output the data stored in the space indicated by the N×M addresses of the second storage unit frame by frame. The data output from the second storage unit frame by frame is interleaved data.

In an embodiment, the N×M frames of data received in step S11 are specifically the N×M frames of data after block convolutional coding. The block convolutional coding is one of FEC coding, which is the prior art and is not described here again.

Figure 2B:
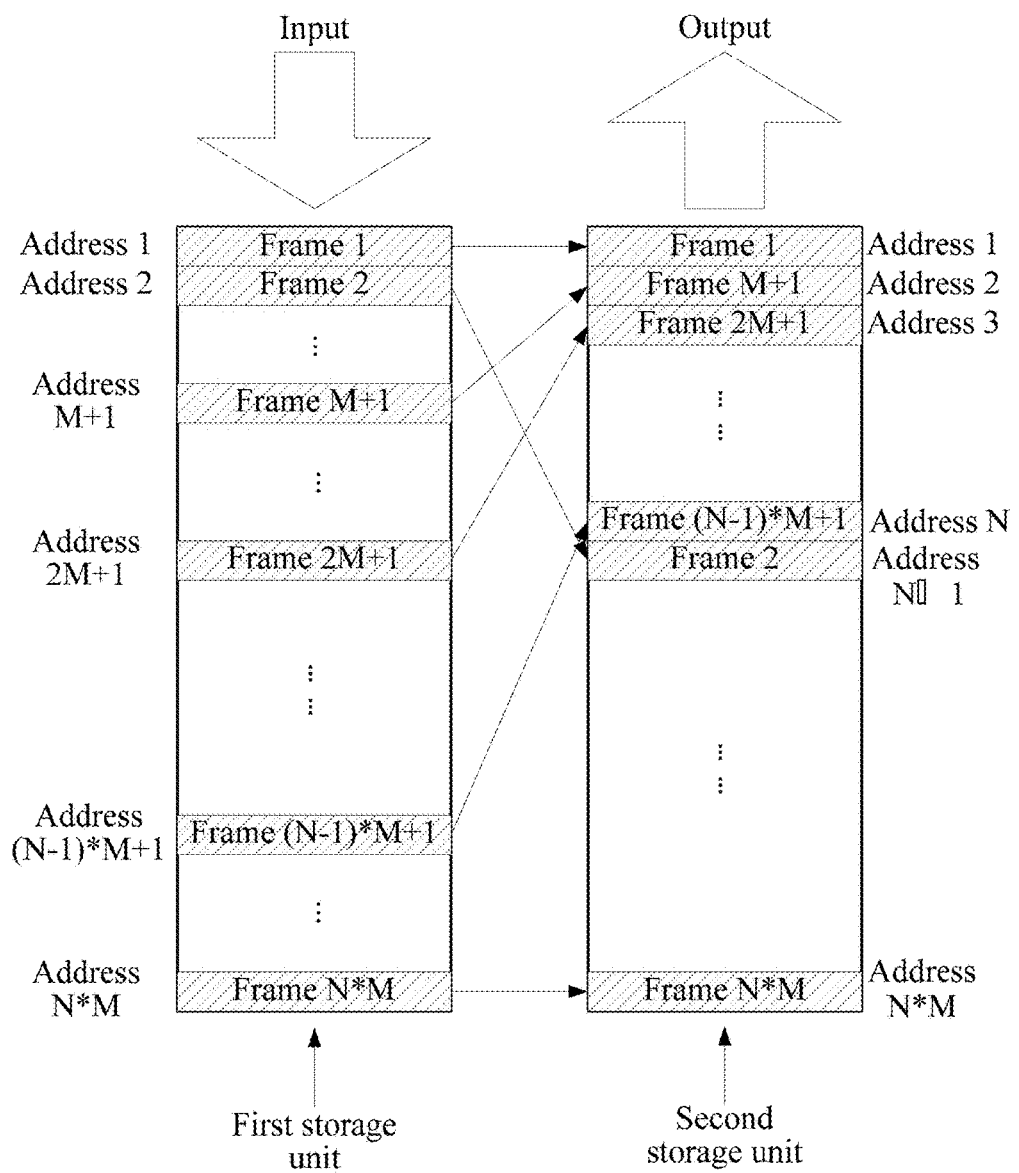
FIG. 2B is a schematic diagram of data transfer in the interleaving method provided in the embodiment of the present invention.

The interleaving method provided in the embodiment of the present invention is further described with reference to the schematic diagram of a data transfer process as shown in FIG. 2B. In this embodiment, both the first storage unit and the second storage unit include the storage space indicated by N×M addresses, and the storage space indicated by each address is capable of storing at least one frame of data.

Firstly, the N×M frames of data are stored sequentially in the storage space indicated by the N×M addresses of the first storage unit, and each frame of data is stored in the storage space indicated by one address. As shown in FIG. 2B, the data stored in the N×M addresses in the first storage unit is sequentially identified as frame 1, frame 2, . . . , and frame N*M.

Next, one frame of data in the storage space indicated by an $((X-1)\times M+Y+1)^{th}$ address of the first storage unit is transferred to the storage space indicated by a $(Y\times N+X)^{th}$ address of the second storage unit, where when N=M=2, X=[1,2] and Y=[0,1]; and when N and M are natural numbers greater than 2, X=1 . . . N; Y=0 . . . M−1. It should be noted that, X needs to take each value from 1 to N (including 1 and N), and likewise, Y needs to take each value from 0 to M−1 (including 0 and M−1). The specific transfer process is as follows:

(1) Y=0, transfer a frame ((X−1)×M+0+1) stored in the storage space indicated by an address ((X−1)×M+0+1) in the first storage unit to the storage space indicated by an address (0×N+X) in the second storage unit, that is:

transfer a frame 1 stored in the storage space indicated by an address 1 in the first storage unit to the storage space indicated by the address 1 in the second storage unit;

transfer a frame M+1 stored in the storage space indicated by an address M+1 in the first storage unit to the storage space indicated by an address 2 in the second storage unit;

transfer a frame 2M+1 stored in the storage space indicated by an address 2M+1 in the first storage unit to the storage space indicated by an address 3 in the second storage unit;

. . .

transfer a frame (N−1)*M+1 stored in the storage space indicated by an address (N−1)*M+1 in the first storage unit to the storage space indicated by an address N in the second storage unit.

(2) Y=1, transfer a frame ((X−1)×M+1+1) stored in the storage space indicated by an address ((X−1)×M+1+1) in the first storage unit to the storage space indicated by an address (1×N+X) in the second storage unit. In this case, X needs to take each value from 1 to N (including 1 and N). When X takes each value from 1 to N, the specific value of X is substituted in an expression of the address, and a specific transfer process of each frame may be explicit, which is not listed here one by one.

(3) Y=2, transfer a frame ((X−1)×M+2+1) stored in the storage space indicated by an address ((X−1)×M+2+1) in the first storage unit to the storage space indicated by an address (2×N+X) in the second storage unit. In this case, X needs to take each value from 1 to N (including 1 and N). When X takes each value from 1 to N, the specific value of X is substituted in an expression of the address, and a specific transfer process of each frame may be explicit, which is not listed here one by one.

. . .

(M) Y=M−1, transfer a frame ((X−1)×M+M−1+1) stored in the storage space indicated by an address ((X−1)×M+M−1+1) in the first storage unit to the storage space indicated by an address ((M−1)×N+X) in the second storage unit. In this case, X needs to take each value from 1 to N (including 1 and N). When X takes each value from 1 to N, the specific value of X is substituted in an expression of the address, and a specific transfer process of each frame may be explicit, which is not listed here one by one.

After the N×M frames of data stored in the first storage unit are transferred to the second storage unit, the second storage unit, with each frame as a unit, outputs the N×M frames of data stored by the second storage unit frame by frame. The data output by the second storage unit is interleaved data.

It should be noted that, in the transfer process described in the foregoing embodiment, it is first assumed that Y takes a specific value and then X takes different values, and it should be understood that, it may also be assumed that X takes a specific value and then Y takes different values.

With the interleaving method provided in the embodiment of the present invention, interleaving may be implemented merely through transferring the data frames to change the original sequence of the data frames, and therefore the implementation complexity is low, in addition, the data frames are transferred in combination with features of the convolutional code, which may achieve a good effect of correcting the burst bit error, and the capacity of correcting the burst bit error linearly increases with the increase of the interleave depth.

Figure 3A:
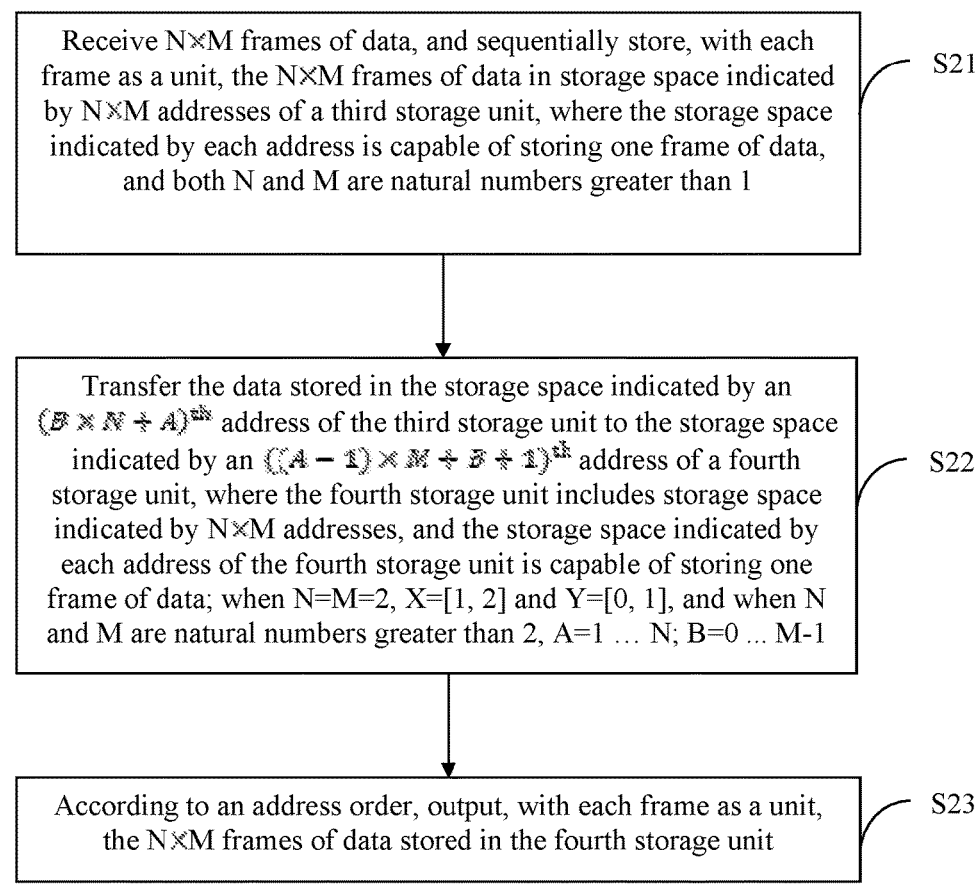
FIG. 3A is a flow chart of a de-interleaving method provided in an embodiment of the present invention.

An embodiment of the present invention further provides a de-interleaving method, and the flow chart of it is shown in FIG. 3A, which includes the following steps:

Step S21: Receive N×M frames of data, and sequentially store, with each frame as a unit, the N×M frames of data in storage space indicated by N×M addresses of a third storage unit, where the storage space indicated by each address is capable of storing one frame of data, and both N and M are natural numbers greater than 1. In the present invention, the N×M represents interleave depth, and specific values of N and M may be determined according to a burst noise level of a channel and a block convolution algorithm, for example, if the depth of one block convolution of the block convolutional code is K, N=K, M is generally a value greater than or equal to 2, and the greater the burst noise of the channel is, the greater the value of M is. In the present invention, the specific values of N and M are not limited thereto.

Step S22: Transfer the data stored in the storage space indicated by a $(B\times N+A)^{th}$ address of the third storage unit in the storage space indicated by an $((A-1)\times M+B+1)^{th}$ address of a fourth storage unit, where the fourth storage unit includes storage space indicated by N×M addresses, and the storage space indicated by each address of the fourth storage unit is capable of storing one frame of data; when N=M=2, A=[1,2] and B=[0,1]; and when N and M are natural numbers greater than 2, A=1 . . . N; B=0 . . . M−1.

In this embodiment, the size of the storage space indicated by each address in the third storage unit and the fourth storage unit may at least match the size of one frame of data, that is, if one frame of data has L bits, the size of the storage space indicated by each address is at least L bits, and the sizes of the third storage unit and the fourth storage unit are at least N×M×L bits.

Step S23: According to an address sequence, output, with each frame as a unit, the N×M frames of data stored in the fourth storage unit.

In an embodiment, the de-interleaving method provided in the embodiment of the present invention may further include: performing block convolutional decoding on the data read from the fourth storage unit. The block convolutional decoding is one of FEC decoding, which is the prior art and is not described here again.

In another embodiment, the performing the block convolutional decoding on the data read from the fourth storage unit specifically includes: taking the data read from the space indicated by an $A^{th}$ address to an $(A \times M)^{th}$ address of the fourth storage unit as a group of data, performing complete convolutional decoding on the group of data, and outputting an $A^{th}$ frame of data. For example, M frames of data stored in the storage space indicated by a $1^{st}$ address to an $M^{th}$ address in the fourth storage unit are taken as a group of data, complete convolutional decoding is performed on the group of data, and a first frame of data is output; while M frames of data stored in the storage space indicated by a $2^{nd}$ address to an $(M+1)^{th}$ address in the fourth storage unit are taken as a group of data, complete convolutional decoding is performed on the group of data, and a $2^{nd}$ frame of data is output. Reference can be made to the prior art for the specific process of the convolutional decoding, which is not described here again.

Figure 3B:
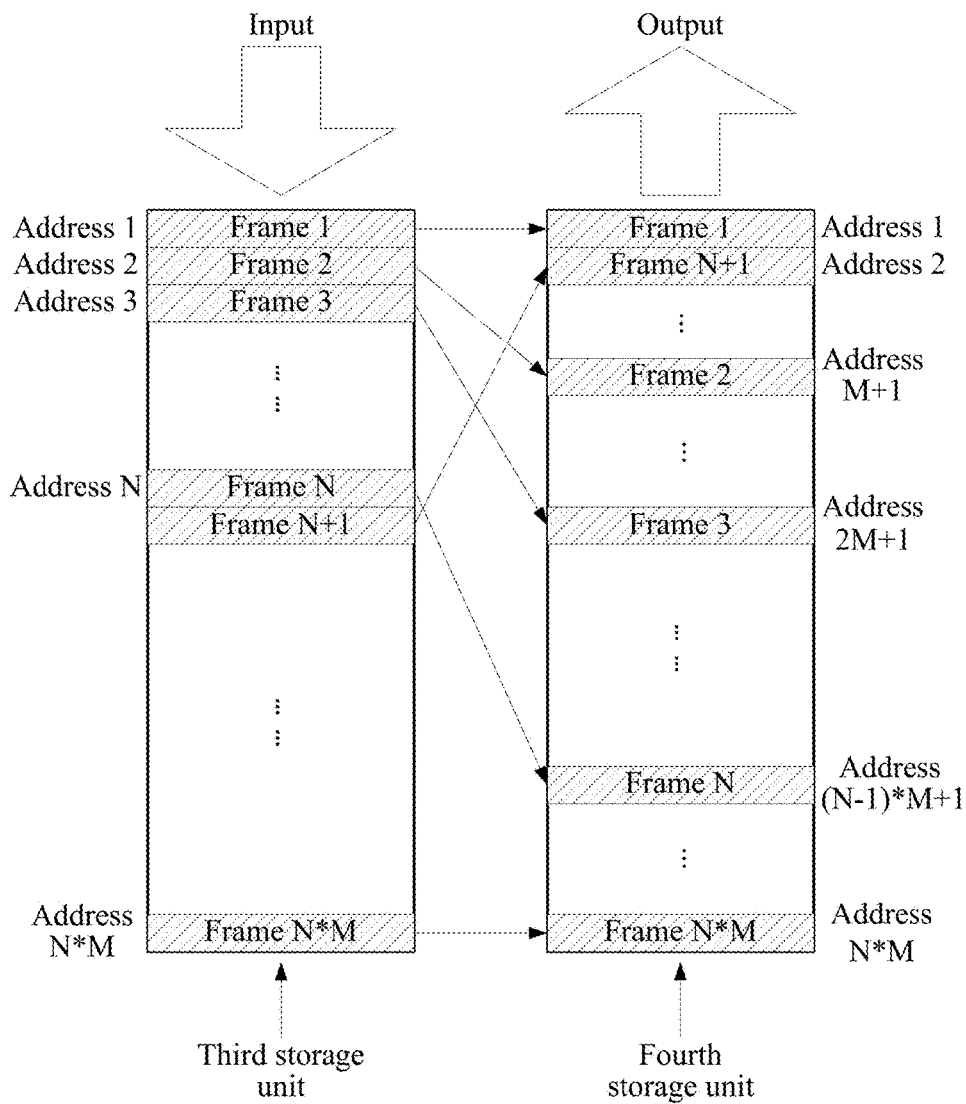
FIG. 3B is a schematic diagram of data transfer in the de-interleaving method provided in the embodiment of the present invention.

The de-interleaving method provided in the embodiment of the present invention is further described with reference to the schematic diagram of a data transfer process as shown in FIG. 3B. In this embodiment, both the third storage unit and the fourth storage unit include the storage space indicated by N×M addresses, and the storage space indicated by each address is at least capable of storing one frame of data.

Firstly, the N×M frames of data from the channel are stored sequentially in the storage space indicated by the N×M addresses of the third storage unit, and each frame of data is stored in the storage space indicated by one address. As shown in FIG. 3B, the data stored in the N×M addresses in the third storage unit is sequentially identified as frame 1, frame 2, . . . , and frame N*M.

Next, one frame of data stored in the storage space indicated by a $(B \times N+A)^{th}$ address of the third storage unit is transferred to the storage space indicated by an $((A-1) \times M+B+1)^{th}$ address of the fourth storage unit, where when N=M=2, A=[1,2] and B=[0,1], and when N and M are natural numbers greater than 2, A=1 . . . N; B=0 . . . M-1. The specific transfer process is as follows:

(1) B=0, a frame (0×N+A) stored in the storage space indicated by an address (0×N+A) in the third storage unit is transferred to the storage space indicated by an address ((A-1)×M+0+1) in the second storage unit, that is:

transfer a frame 1 stored in the storage space indicated by an address 1 in the third storage unit to the storage space indicated by the address 1 in the fourth storage unit;

transfer a frame 2 stored in the storage space indicated by an address 2 in the third storage unit to the storage space indicated by an address M+1 in the fourth storage unit;

transfer a frame 3 stored in the storage space indicated by an address 3 in the third storage unit to the storage space indicated by an address 2M+1 in the fourth storage unit;

. . .

transfer a frame N stored in the storage space indicated by an address N in the third storage unit to the storage space indicated by an address (N-1)*M+1 in the fourth storage unit;

(2) B=1, transfer a frame (1×N+A) stored in the storage space indicated by an address (1×N+A) in the third storage unit to the storage space indicated by an address ((A-1)×M+1+1) in the fourth storage unit. In this case, A needs to take each value from 1 to N (including 1 and N). When A takes each value from 1 to N, the specific value of A is substituted in an expression of the address, and a specific transfer process of each frame may be explicit, which is not listed here one by one.

(3) B=2, a frame (2×N+A) stored in the storage space indicated by an address (2×N+A) in the third storage unit is transferred to the storage space indicated by an address ((A-1)×M+2+1) in the fourth storage unit. In this case, A needs to take each value from 1 to N (including 1 and N). When A takes each value from 1 to N, the specific value of A is substituted in an expression of the address, and a specific transfer process of each frame may be explicit, which is not listed here one by one.

. . .

(M) B=M-1, a frame ((M-1)×N+A) stored in the storage space indicated by an address ((M-1)×N+A) in the third storage unit is transferred to the storage space indicated by an address ((A-1)×M+M-1+1) in the fourth storage unit. In this case, A needs to take each value from 1 to N (including 1 and N). When A takes each value from 1 to N, the specific value of A is substituted in an expression of the address, and a specific transfer process of each frame may be explicit, which is not listed here one by one.

After the N×M frames of data stored in the third storage unit are transferred to the fourth storage unit, the fourth storage unit outputs the N×M frames of data stored by the fourth storage unit frame by frame with each frame as a unit. The data output by the fourth storage unit is the de-interleaved data.

With the de-interleaving method provided in the embodiment of the present invention, de-interleaving may be implemented merely through transferring the data frames to change the original sequence of the data frames, and therefore the implementation complexity is low, in addition, the data frames are transferred in combination with features of the convolutional code, which may achieve a good effect of correcting the burst bit error, and the capacity of correcting the burst bit error linearly increases with the increase of the interleave depth.

Figure 4A:
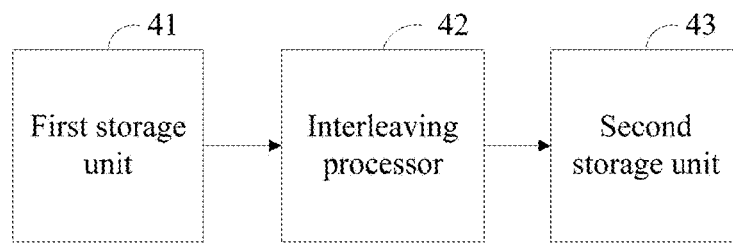
FIG. 4A is a first schematic structural diagram of an interleaver provided in an embodiment of the present invention.

Corresponding to the interleaving method described in the foregoing embodiment, an embodiment of the present invention further provides an interleaver, and the structure of it is shown in FIG. 4A, which includes: a first storage unit 41, an interleaving processor 42 and a second storage unit 43. Both the first storage unit 41 and the second storage unit 43 include storage space indicated by N×M addresses, the storage space indicated by each address is capable of storing one frame of data, and both N and M are natural numbers greater than 1. In this embodiment, the size of the storage space indicated by each address in the first storage unit 41 and the second storage unit 43 may at least match the size of one frame of data, that is, if one frame of data has L bits, the size of the storage space indicated by each address is at least L bits, and the sizes of the first storage unit and the second storage unit are at least N×M×L bits.

The first storage unit 41 is configured to receive N×M frames of data, and sequentially store, with each frame as a unit, the N×M frames of data in the storage space indicated by N×M addresses.

The interleaving processor 42 is configured to read one frame of data from the storage space indicated by an $((X-1) \times M+Y+1)^{th}$ address of the first storage unit 41, and store the one frame of data, which has been read, in the storage space indicated by a $(Y \times N+X)^{th}$ address of the second storage unit 43, where when N=M=2, X=[1,2] and Y=[0,1], and when N and M are natural numbers greater than 2, X=1 . . . N; Y=0 . . . M-1.

The second storage unit 43 is configured to output the data stored in the space indicated by the N×M addresses frame by frame according to an address sequence.

Figure 4B:
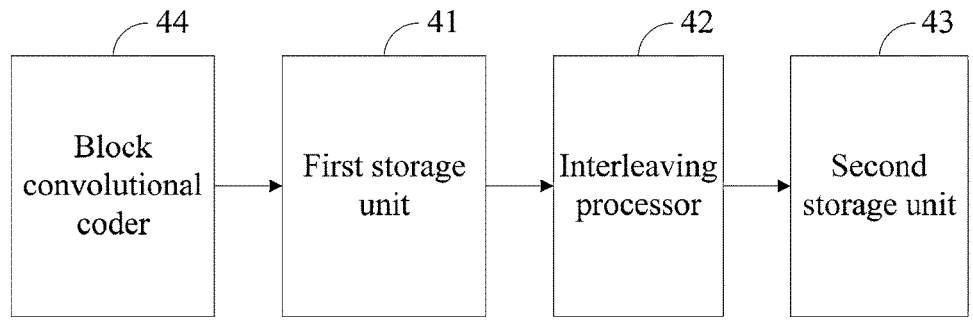
FIG. 4B is a second schematic structural diagram of an interleaver provided in an embodiment of the present invention.

In an embodiment, a block convolutional coder may also be integrated in the interleaver of the embodiment of the present invention. As shown in FIG. 4B, the interleaver provided in the embodiment of the present invention may further include a block convolutional coder 44, configured to perform block convolutional coding on the data input to the block convolutional coder, and send the data acquired from the block convolutional coding to the first storage unit 41.

For transfer processing of the interleaver provided in the embodiment of the present invention, reference can be made to the foregoing relevant description of the embodiment of the interleaving method, which is not described here again.

With the interleaver provided in the embodiment of the present invention, interleaving may be implemented merely through transferring the data frames to change the original sequence of the data frames, and therefore the implementation complexity is low, in addition, the data frames are transferred in combination with features of the convolutional code, which may achieve a good effect of correcting the burst bit error, and the capacity of correcting the burst bit error linearly increases with the increase of the interleave depth.

Figure 5A:
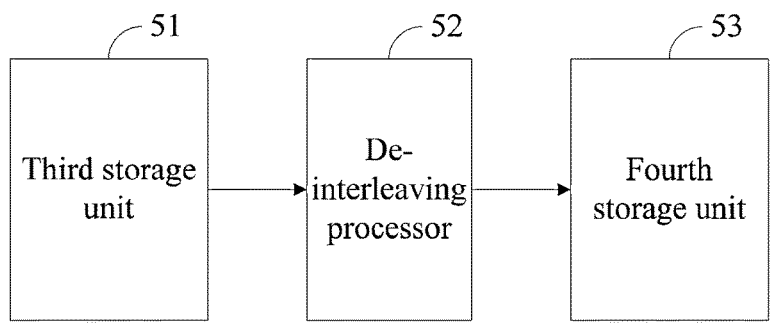
FIG. 5A is a first schematic structural diagram of a de-interleaver provided in an embodiment of the present invention.
Figure 5B:
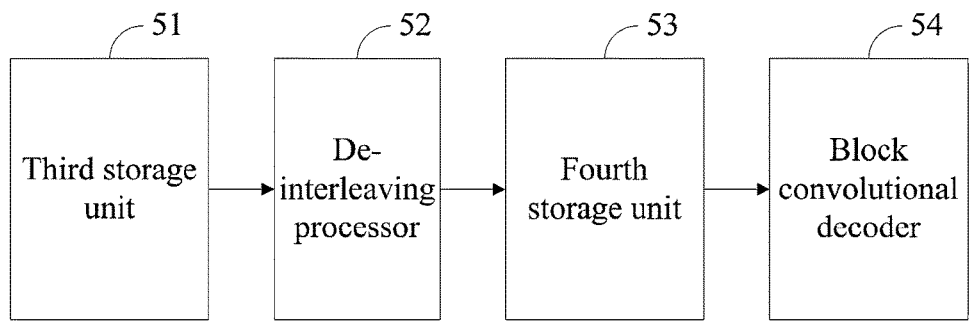
FIG. 5B is a second schematic structural diagram of a de-interleaver provided in an embodiment of the present invention.

Corresponding to the de-interleaving method described in the foregoing embodiment, an embodiment of the present invention further provides a de-interleaver, and the structure of it is shown in FIG. 5A, which includes: a third storage unit 51, an de-interleaving processor 52 and a fourth storage unit 53. Both the third storage unit 51 and the fourth storage unit 53 include storage space indicated by N×M addresses, the storage space indicated by each address is capable of storing one frame of data, and both N and M are natural numbers greater than 1. In this embodiment, the size of the storage space indicated by each address in the third storage unit 51 and the fourth storage unit 53 may at least match the size of one frame of data, that is to say, if one frame of data has L bits, the size of the storage space indicated by each address is at least L bits, and the sizes of the third storage unit 51 and the fourth storage unit 53 are at least N×M×L bits.

The third storage unit 51 is configured to receive N×M frames of data, and sequentially store, with each frame as a unit, the N×M frames of data in the storage space indicated by N×M addresses.

The de-interleaving processor 52 is configured to read one frame of data from the storage space indicated by a $(B \times N+A)^{th}$ address of the third storage unit, and store the one frame of data, which has been read, in the storage space indicated by an $((A-1) \times M+B+1)^{th}$ address of the fourth storage unit; when N=M=2, A=[1,2] and B=[0,1]; and when N and M are natural numbers greater than 2, A=1 . . . N; B=0 . . . M−1.

The fourth storage unit 53 is configured to, according to an address sequence, output, with each frame as a unit, the N×M frames of data stored by the fourth storage unit.

In an embodiment, a block convolutional decoder may also be integrated in the de-interleaver provided in the embodiment of the present invention. As shown in FIG. 5A, the de-interleaver provided in the embodiment of the present invention may further include a block convolutional decoder 54, which is configured to perform block convolutional decoding based on the data output by the fourth storage unit 53. In another embodiment, the block convolutional decoder specifically takes the data in the space indicated by an $A^{th}$ address to an $(A+M-1)^{th}$ address in the fourth storage unit as a group of data, performs complete convolutional decoding on the group of data, and outputs an $A^{th}$ frame of data.

For transfer processing of the de-interleaver provided in the embodiment of the present invention, reference can be made to the foregoing relevant description of the embodiment of the de-interleaving method, which is not described here again.

With the de-interleaver provided in the embodiment of the present invention, de-interleaving may be implemented merely through transferring the data frames to change the original sequence of the data frames, and therefore the implementation complexity is low, in addition, the data frames are transferred in combination with features of the convolutional code, which may achieve a good effect of correcting the burst bit error, and the capacity of correcting the burst bit error linearly increases with the increase of the interleave depth.

Persons skilled in the art should understand that all or a part of the steps in the method of the embodiments may be accomplished through a program instructing related hardware. The program may be stored in a computer readable storage medium, including a read only memory, a random access memory, a magnetic disk or an optical disk.

The foregoing descriptions are merely exemplary embodiments of the present invention, but not intended to limit the present invention. Various modifications and replacements that may be easily thought of by persons skilled in the art without departing from the technical scope of the present invention should be considered falling within the protection scope of the present invention. Therefore, the protection scope of the present invention is subject to the appended claims.

What is claimed is:

1. An interleaving method, comprising:
   receiving N×M frames of data, and sequentially storing, with each frame as a unit, the N×M frames of data in storage space indicated by N×M addresses of a first storage unit, wherein storage space indicated by each address is capable of storing one frame of data, and N and M are natural numbers greater than 1;
   transferring data stored in storage space indicated by an $((X-1) \times M+Y+1)^{th}$ address of the first storage unit to storage space indicated by a $(Y \times N+X)^{th}$ address of a second storage unit, wherein the second storage unit comprises storage space indicated by N×M addresses, and storage space indicated by each address of the second storage unit is capable of storing one frame of data; and
   outputting data, according to an address sequence, stored in the space indicated by the N×M addresses of the second storage unit frame by frame.

2. The method according to claim 1, wherein received N×M frames of data are specifically N×M frames of data after block convolutional coding.

3. A de-interleaving method, comprising:
   receiving N×M frames of data, and sequentially storing, with each frame as a unit, the N×M frames of data in storage space indicated by N×M addresses of a third storage unit, wherein storage space indicated by each address is capable of storing one frame of data, and both N and M are natural numbers greater than 1;
   transferring data stored in the storage space indicated by a $(B \times N+A)^{th}$ address of the third storage unit to storage space indicated by an $((A-1) \times M+B+1)^{th}$ address of a fourth storage unit, wherein the fourth storage unit comprises storage space indicated by N×M addresses, and storage space indicated by each address of the fourth storage unit is capable of storing one frame of data; and outputting, with each frame as a unit, according to an address sequence, N×M frames of data stored in the fourth storage unit.

4. The method according to claim 3, further comprising: performing block convolutional decoding on data output by the fourth storage unit.

5. The method according to claim 4, wherein the performing the block convolutional decoding on the data output by the fourth storage unit comprises:

taking data output by space indicated by an $A^{th}$ address to an $(A \times M)^{th}$ address of the fourth storage unit as a group of data, performing convolutional decoding on the group of data, and outputting an $A^{th}$ frame of data.

6. An interleaver, comprising: a first storage unit, a second storage unit, and an interleaving processor, wherein both the first storage unit and the second storage unit have storage space indicated by N×M addresses, storage space indicated by each address is capable of storing one frame of data, and both N and M are natural numbers greater than 1;

the first storage unit is configured to receive N×M frames of data, and sequentially store, with each frame as a unit, the N×M frames of data in the storage space indicated by N×M addresses;

the interleaving processor is configured to read one frame of data from storage space indicated by an $((X-1) \times M+Y+1)^{th}$ address of the first storage unit, and store the one frame of data, which has been read, in storage space indicated by a $(Y \times N+X)^{th}$ address of the second storage unit; and the second storage unit is configured to output data stored in the space indicated by N×M addresses frame by frame according to an address sequence.

7. The interleaver according to claim 6, further comprising: a block convolutional coder, configured to perform block convolutional coding on data input to the block convolutional coder, and send data obtained through the block convolutional coding to the first storage unit.

8. A de-interleaver, comprising: a third storage unit, a fourth storage unit, and a de-interleaving processor, wherein both the third storage unit and the fourth storage unit have storage space indicated by N×M addresses, storage space indicated by each address is capable of storing one frame of data, and both N and M are natural numbers greater than 1;

the third storage unit is configured to receive N×M frames of data, and sequentially store, with each frame as a unit, the N×M frames of data in storage space indicated by the N×M addresses of the third storage unit;

the de-interleaving processor is configured to read one frame of data from storage space indicated by a $(B \times N+A)^{th}$ address of the third storage unit, and store the one frame of data, which has been read, in storage space indicated by an $((A-1) \times M+B+1)^{th}$ address of the fourth storage unit; and the fourth storage unit is configured to, according to an address sequence, output, with each frame as a unit, N×M frames of data stored by the fourth storage unit.

9. The de-interleaver according to claim 8, further comprising: a block convolutional decoder, configured to perform block convolutional decoding based on data output by the fourth storage unit.

10. The de-interleaver according to claim 9, wherein the block convolutional decoder is configured to take data output from storage space indicated by an $A^{th}$ address to an $(A+M-1)^{th}$ address of the fourth storage unit as a group of data, perform convolutional decoding on the group of data, and output an $A^{th}$ frame of data.

* * * * *